United States Patent [19]

Chen et al.

[11] Patent Number: 5,780,905
[45] Date of Patent: Jul. 14, 1998

[54] ASYMMETRICAL, BIDIRECTIONAL TRIGGERING ESD STRUCTURE

[75] Inventors: Wayne T. Chen, Plano; Ross E. Teggatz, McKinney; Julian Z. Chen, Dallas, all of Tex.

[73] Assignee: Texas Instruments Incorporated, Dallas, Tex.

[21] Appl. No.: 768,358

[22] Filed: Dec. 17, 1996

[51] Int. Cl.$^6$ .................................................. H01L 23/62
[52] U.S. Cl. ...................... 257/355; 257/565; 257/566
[58] Field of Search ................................ 257/355, 357, 257/360, 361, 365, 565, 566, 577

[56] References Cited

U.S. PATENT DOCUMENTS

| | | | |
|---|---|---|---|
| 4,870,530 | 9/1989 | Hurst et al. | 257/362 |
| 5,400,202 | 3/1995 | Metz et al. | 361/56 |
| 5,602,404 | 2/1997 | Chen et al. | 257/356 |

*Primary Examiner*—David B. Hardy
*Attorney, Agent, or Firm*—Alan K. Stewart; Wade J. Brady, III; Richard L. Donaldson

[57] ABSTRACT

An ESD protection structure which includes, preferably a single semiconductor chip, a forward SCR for coupling across a source of potential and a reverse SCR for coupling across the same source of potential which is non-symmetrical to the forward SCR. The breakdown voltage of the forward SCR is different from the breakdown voltage of the reverse SCR. Each of the SCRs has a separate triggering mechanism. None of the anode, cathode and triggering elements of the forward SCR are common to the reverse SCR. A unidirectional device, preferably a Schottky diode, is disposed in the body of semiconductor material between the forward and reverse SCRs to prevent conduction from the body of semiconductor material when the source of potential across the SCRs is reversed.

16 Claims, 1 Drawing Sheet

ASYMMETRICAL, BIDIRECTIONAL TRIGGERING ESD STRUCTURE

BACKGROUND OF THE INVENTION

1. Field of the Invention

This invention relates to a variable voltage as metrical, bidirectional triggering electrostatic discharge (ESD) protection structure.

2. Brief Description of the Prior Art

In, for example, pre-FET driver circuits for H-bridge type applications, the pins of the integrated circuit interfacing to the gate, source and drain of the power FET require high positive voltages as well as negative voltages with respect to the substrate voltage. Due to the small dimensions of various portions of integrated circuits, excessive electrostatic discharges can cause damage and/or complete failure of the integrated circuit. The ESD protection devices are therefore required to protect the internal semiconductor circuitry when the integrated circuit pin voltages exceed normal operating conditions and these ESD protection circuits should not cause any noticeable difference during normal operation. Presently used ESD structures include a body diode which, when negative voltages are involved, become forward biased and conduct. Such ESD structures are large in order to dissipate energy in the ESD strike. In some applications it is desired to eliminate this body diode in ESD structures because the body diode is large and does not allow the pin to go beneath substrate voltage (where, in many applications, the substrate is tied to ground). While a blocking diode, such as a Zener diode, can be used to counteract the body diode, such diodes are not good ESD protection devices. The Zener diodes can fuse and render the ESD protection device useless unless they are very large, this not being a cost-effective approach. Accordingly, another approach is required. At present, there is no known asymmetrical ESD structure.

Another problem with a zener diode structure is that a large amount of power is dissipated therein (V*I=P). As such, a device that triggers at a high voltage, but then conducts current at a lower voltage, is desired. An SCR describes this type of structure. Since the SCR conducts the ESD current with a lower voltage drop thereacross, the SCR can be small because its power is low.

Prior art semiconductor structures that are SCR-like either do not provide a negative going SCR or do not provide an asymmetrical SCR action. Other structures that do go negative do not provide high positive triggering voltages that are required in power applications.

SUMMARY OF THE INVENTION

In accordance with the present invention, there is provided an asymmetrical, bidirectional triggering ESD structure which is an SCR in both directions. Therefore the device can be fabricated as a small device, yet provide good power dissipation capabilities. In addition, the structure in accordance with the present invention, which is a unidirectional device and preferably a Schottky diode, allows normal signals to traverse voltages beneath the substrate (IC ground) voltage. The action of the blocking device prevents the positive SCR device from conducting current from the substrate when the pad region 7B in FIG. 1 goes negative (there is an inherent parasitic diode from the N-type substrate to the N tank which is undesirable).

Briefly, there is provided a Zener diode as a blocking diode as in the prior art, however another mechanism is provided to absorb the power. A Zener diode is used to trigger the negative going ESD structure.

DESCRIPTION OF THE PREFERRED EMBODIMENT

Figure 1:
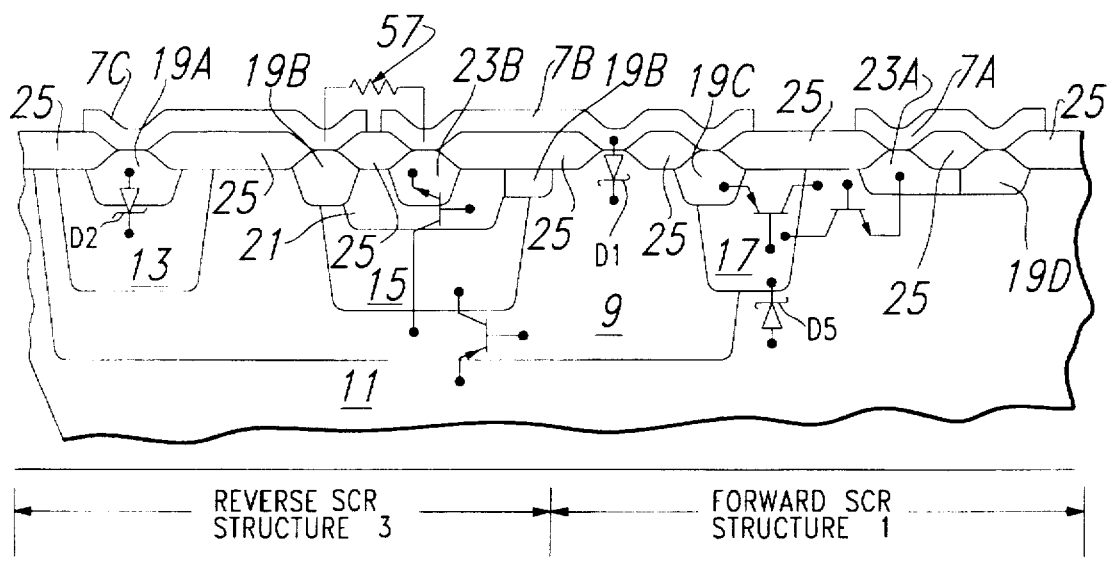
FIG. 1 is a cross section of a variable voltage asymmetrical bidirectional ESD protection structure in accordance with the present invention.

Referring to FIG. 1, there is shown the equivalent circuit of a variable voltage asymmetrical bidirectional ESD protection structure in accordance with the present invention. The structure includes a forward SCR structure 1 with arrows showing that portion of the structure and a reverse SCR structure 3 with arrows showing that portion of the structure formed in a P-type epitaxial or substrate layer 11. A high voltage N-type (HVN) tank 9 is formed in the P-type layer 11, a low voltage N-type (LVN) tank 13 is formed in the tank 9, a P-type D-well 15 is formed in the tank 9 spaced from the tank 13 and a low voltage N-type (LVN) tank 17 is formed partly in the tank 9 and partly in the P-type epitaxial layer 11 and spaced from the tank 13 and the D-well 15. Each of tanks 13 and 17 and D-well 15 extend to the active surface of the tank 9. P-type source/drain region 19A is provided within the N-type tank 13. P-type source/drain region 19B is provided to contact D-well P-type tank 15. P-type source/drain regions 19A and 19B are electrically connected with metal interconnection layer 7C through ohmic contacts. P-type source/drain region 19C is provided within N-type tank 17. P-type source/drain region 19D is provided within epitaxial layer 11. The upper portion 21 of the D-well 15 is arsenic-doped to (N-)-type and regions 23A over the layer 11 and adjacent the source/drain region 19D thereat as well as 23B over a portion of the arsenic doped region 21 are N-type source/drain regions. Field oxide 25 is disposed over the entire surface except for the source/drain regions 19A to 19D and N-type regions 23A and 23B and Schottky diode opening 5. A metal 1 layer 7 is shown in three sections, section 7A being ground, section 7B being the pad and section 7C 7C being disposed between the source/drains 19A and 19B of the tank 13 and the D-well 15. Section 7B is coupled between the source/drain 23B of the D-well 15, the tank 9 to form a Schottky diode 5 therewith and the source drain 19C, and section 7A is coupled between the source/drain 23A and the source/drain 19D.

The forward SCR 1 includes the Schottky diode 5 formed between the metal 1 layer 7B which also serves as the pad being protected and the high voltage N-type tank 9. A PNP transistor is provided by the P-type source/drain region 19C with the N-type tank 17 and the P-type substrate layer 11, creating the upper part of the SCR. The lower part of the SCR is an NPN transistor and is created by the tank 17, the substrate 11 and the N-type source/drain region 23A. It can be seen that regions of N-type tank 17 and P-type layer 11 are common to the PNP and NPN transistors. The substrate 11 provides resistance between the common terminals of the base of the NPN transistor and the collector of the PNP transistor which is coupled to ground via the metal 7A contacting the emitter of the NPN transistor. It follows that the forward SCR PNPN structure 1 is composed of the region 19C over the tank 17 (P), the tank 17 with the tank 9 which are tied together (N), the substrate 11 (P) and the region 23A over the substrate 11 (N).

Figure 2A:
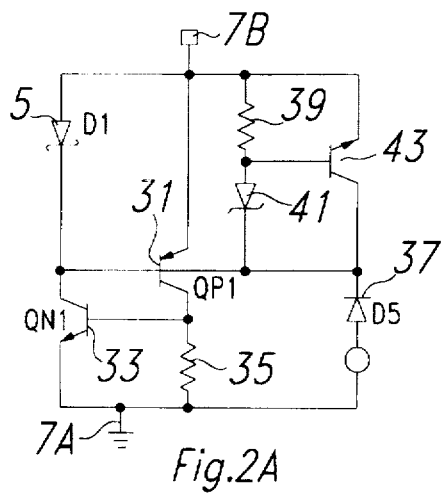
FIG. 2A is a circuit diagram of the forward SCR structure of FIG. 1.
Figure 2B:
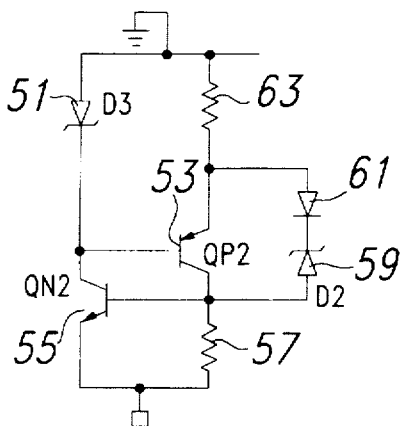
FIG. 2B is a circuit diagram of the reverse SCR structure of FIG. 1.

FIG. 2A shows the equivalent circuit of the above described forward SCR structure of FIG. 1, wherein the Schottky diode 5 formed by the metal 7B and tank 9 is coupled between a voltage source at pad 7B and the common connection of the base of the PNP transistor 31 and collector of the NPN transistor 33. As can be seen, the metal interconnect 7B couples the diode 5 to the emitter of transistor 31 at region 19C (FIG. 1). The NPN transistor 33 is resistively coupled between the diode 5 and ground, which is the metal ground 7A, and the PNP transistor 31 is coupled between the voltage source and the common connection of the base of transistor 33. A resistor 35, which is the resistance provided by the substrate 11, is coupled between the base of transistor 33 and ground and the emitter of the NPN transistor 33 is grounded via metal 7A. The diode 37 is formed by the substrate 11, which is grounded, and the parallel combination of tank 9 and tank 17. The polysilicon resistor 29 of FIG. 2A and polysilicon resistor 57 of FIG. 2B are the same resistor and shown in FIG. 1 as resistor 57. Zener diode 41 of FIG. 2A is depicted in FIG. 1 by the P-type source/drain 19A and the tank 13 and NPN transistor 43 in FIG. 2A is depicted in FIG. 1 by the high voltage N-tank 9 which is the collector, D-well 15 which is the base region and N-type source/drain 23B which is the emitter.

The reason for the Schottky diode 5 is to allow the pad or metal 7B which is not grounded to go beneath substrate voltage as well as to prevent a voltage build-up across base-emitter junction of the PNP device that may occur during fast transients. If an N-type source/drain implant were to be used in place of the Schottky diode 5, as in the prior art, this would short circuit the pad 7B to the tank 9 and provide a parasitic diode between the tank 9 and the substrate 11, which is grounded. That would clamp the pad 7B output to one diode voltage beneath substrate 11 voltage. The Schottky diode 5 blocks that parasitic diode.

Returning to FIG. 1, the reverse SCR 3 includes an NPN transistor composed of the N-type emitter regions 21, 23B over the P-type well base region 15 and N-type tank collector region 9. A Zener diode formed by the P-type region 19A and the N-type tank 13 thereunder is coupled to the collector of the NPN transistor formed by N-type tank 9. The PNP transistor is formed by the P-type substrate emitter region 11, the N-type tank base region 9 and the P-type well collector region 15.

FIG. 2B is the equivalent circuit of the reverse SCR 3. The ground shown corresponds to the substrate 11. The diode 51 (not shown in FIG. 1) between ground and common region of the base of PNP transistor 53 collector of NPN transistor 55 is formed by the junction of the ground metal 7A and the N-type tank 9. The diode 61 is formed by the junction of the substrate 11 and the N-type tanks 9, 13 and 17. The resistor 63 between ground and the emitter of PNP transistor 53 is the substrate resistance and the resistor 57 is the polysilicon resistor 57 shown in FIG. 1. The Zener diode 59 is discussed above and is formed by regions 19A and tank 13.

It is desired to have a well defined trigger point for the reverse SCR 3 to protect internal circuitry. Therefore, a well-defined breakdown mechanism is required and this is provided by way of the Zener diode. This Zener diode begins to conduct current in the reverse direction as soon as the voltage thereacross is at a predetermined voltage which can be above or below ground, such as, for example, −16 volts in the present embodiment. The Zener diode is formed by the tank 13 and the P-type region 19A thereover. When the voltage on the pad 7B is sufficiently negative to break down the Zener diode 59, current will flow through the diode 59 and the polysilicon resistor 57 to generate a voltage potential across that resistor. That potential is used to increase the $V_{be}$ of the NPN transistor 55 portion of the reverse SCR 3. A polysilicon resistor 57, which is a $V_{be}$ trigger for NPN transistor 55, bridges the metal pad portion 7B and the metal 7A contacting the Zener diode 59. Schottky diode 51 is a protective diode not shown in FIG. 1 to alleviate capacitive coupling and to keep $V_{be}$ of the PNP transistor of the reverse SCR structure 3 below its turn on voltage. The capacitive coupling due to fast transients on the integrated circuit may be enough to trigger the negative SCR. This Schottky diode would be formed by providing another metal connection to the region forming the base of the PNP transistor or the collector of the NPN transistor which is tank 9 with tank 9 being extended to the left as shown in FIG. 1. The diode is required to sustain high reverse bias without breaking down. Diode 51 can be omitted with an open circuit between the base of transistor 53 and ground.

In operation, there is an attempt to prevent excessive buildup of positive voltage on the pad 7B. With reference to FIG. 2A, as the voltage on the pad 7B builds up or rises, some current is conducted through Schottky diode 5 and the voltage on the tank 9 and tank 17 will be biased up. This means that the voltage on the pad 7B, base of the PNP transistor 31 and collector of the NPN transistor 33 will be increased. Eventually there is a breakdown between tank 9 (which is the base of the PNP transistor 31) and the substrate (which is the collector of the PNP transistor 31 and the base of the NPN transistor 33). Once that breakdown occurs, current flows from the tank 9 to the substrate 11 and increases the voltage drop across the substrate resistance 35, this being across the base/emitter of the NPN transistor 33. The NPN transistor 33 now having both the current and voltage necessary to turn on NPN transistor 33 turns on and triggers the SCR 1 which is the SCR shown in FIG. 2A.

For the negative strike as shown by the SCR 3 of FIG. 2B, the Zener diode 59 is used to trigger the SCR 3. With the pad 7B going negative, eventually the Zener diode 59 will break down and current will be conducted through a resistance 63, the Zener diode 59 and the resistor 57. As the voltage across resistor 57 builds up, a voltage $V_{be}$ is generated for the NPN transistor 55. The NPN transistor 55 then turns on and the PNP transistor 53 then turns on and SCR 51 triggers.

To discuss the circuit in an alternative manner, in the positive direction, an SCR 1 is created by the P+ source/drain implant 19C that also acts as the anode, the low-voltage N-tank 17, P-type substrate 11 and N+-type source/drain 23A which is also the cathode. The triggering mechanism of the SCR 1 is the reverse breakdown of the diode junction between the N-type substrate 11 and the tank 17. Holding voltage is defined by the tank 17 resistance across the emitter-base junction of PNP transistor 53. In the negative direction, the Schottky diode formed by metal 1 7B and N-type tank 9 acts as a blocking diode to the substrate 11.

A similar device is provided in the positive SCR strike. The four layer SCR device 3 is formed as described above. The HVN tank 9 is extended beyond N- type tank 17 so that N-type tank 17 is wholly encompassed by N-type tank 9 to provide for higher breakdowns to the substrate 11 during the negative ESD strikes. Another variation is the overlap of LVN tank regions 13, 17 and HVN tank region 9, this varying the breakdown/triggering mechanism of the SCR structure. Also differing from prior art SCR structure is the replacement of the NSD ohmic contact to the LVN tank with a Schottky structure to the tank 9. During the negative ESD strike, SCR 3 is used. The triggering mechanism is the Zener diode 59 which triggers the SCR 3 by supplying the base current drive for the NPN transistor 55. Other implants may be used to replace P-type source/drain 19A and tank 13 to offer different breakdowns.

It follows that one side of the structure of FIG. 1 is used for positive going voltages and the other side is used for negative going voltages on the pad 7B and may exist in separate N-type tanks.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. An ESD protection structure which comprises:
    (a) a forward SCR for coupling across a source of potential having different potential levels, the forward SCR having an anode, a cathode, and a triggering element;
    (b) a reverse SCR for coupling across said source of potential non-symmetrical to said forward SCR, the reverse SCR having an anode, a cathode, and a triggering element, none of the anode, cathode, and triggering element of said forward SCR are common to said reverse SCR.

2. The structure of claim 1 wherein each said SCR has a predetermined breakdown voltage, the predetermined breakdown voltage of said forward SCR being different from the predetermined breakdown voltage of said reverse SCR.

3. The structure of claim 2 wherein said forward SCR and said reverse SCR are disposed on a single semiconductor chip.

4. The structure of claim 1 wherein said forward SCR and said reverse SCR are disposed on a single semiconductor chip.

5. An integrated circuit ESD protection structure which comprises:
    (a) a unitary body of semiconductor material;
    (b) first and second spaced apart circuit termination locations disposed on said unitary body;
    (c) a first circuit disposed in said body between said first and second circuit termination locations for directing current only in a first direction between said first and second circuit termination locations;
    (d) a second circuit disposed in said body between said first and second circuit termination locations for directing current only in a second direction between said first and second circuit termination locations opposite to said first direction; and
    (e) a unidirectional device disposed in said body between said first and second circuits and coupled to said first circuit termination location to prevent conduction from said body to said first circuit location when said second circuit termination location is at a higher voltage than said first circuit termination location.

6. The structure of claim 5 wherein said unidirectional device is a Schottky diode.

7. An integrated circuit ESD protection structure which comprises:
    (a) a body of semiconductor material of a first conductivity type;
    (b) a first tank of opposite conductivity type disposed in said body;
    (c) a second tank of first conductivity type disposed partially in said tank and partially in said body external to said tank;
    (d) one of a forward or reverse SCR disposed in said first tank and said body;
    (e) the other of a forward or reverse SCR disposed in said second tank and said body; and
    (f) a unidirectional device disposed in said first tank preventing current flow from said first tank to an electrical conductor coupled to said first tank when the voltage on said electrical conductor exceeds the voltage of said body.

8. The circuit of claim 7 wherein said unidirectional device is a Schottky diode.

9. The circuit of claim 8 wherein said first conductivity type is P-type.

10. The circuit of claim 7 wherein said first conductivity type is P-type.

11. An ESD protection circuit comprising:
    (a) a first terminal and a second terminal;
    (b) an SCR coupled for conduction between said first and second termainals;
    (c) a first normally non-conducting triggering device coupled between said first and second terminals and to said SCR and responsive to a voltage thereacross of at least a predetermined minimum value to cause said SCR to conduct; and
    (d) a second normally non-conducting device coupled to one of said first and second terminals and said SCR and responsive to conduction of said SCR to allow further conduction between said first and second terminals.

12. The circuit of claim 11 wherein said first device is a Zener diode.

13. The circuit of claim 12 wherein said second device is a Zener diode.

14. The circuit of claim 13 wherein said SCR includes a first electrode coupled to said first terminal, a second electrode coupled to said second terminal and control means, said first device coupled to said control means and, through resistance, to said first terminal for normal conduction in a first direction and said second device being coupled to said control means and said first terminal for normal conduction in a direction opposite to said first device.

15. The circuit of claim 11 wherein said second device is a Zener diode.

16. The circuit of claim 11 wherein said SCR includes a first electrode coupled to said first terminal, a second electrode coupled to said second terminal and control means, said first device coupled to said control means and, through resistance, to said first terminal for normal conduction in a first direction and said second device being coupled to said control means and said first terminal for normal conduction in a direction opposite to said first device.

* * * * *